United States Patent
Roesch et al.

Patent Number: 6,049,447
Date of Patent: *Apr. 11, 2000

[54] CURRENT LIMITING DEVICE

[75] Inventors: Helmut Roesch, Sinzing; Hermann Zierhut, Neutraubling, both of Germany

[73] Assignee: Siemens AG, Munich, Germany

[*] Notice: This patent is subject to a terminal disclaimer.

[21] Appl. No.: 09/129,326

[22] Filed: Aug. 4, 1998

Related U.S. Application Data

[63] Continuation of application No. 08/596,240, filed as application No. PCT/DE93/00824, Sep. 8, 1993.

[51] Int. Cl.[7] .................................................. H02H 9/00
[52] U.S. Cl. ................................................. 361/58; 361/93.9
[58] Field of Search ................................ 361/18, 54, 56, 361/57, 58, 90–93, 98, 99, 101, 102, 91.1, 91.5, 91.7, 93.1, 93.9

[56] References Cited

FOREIGN PATENT DOCUMENTS

| 0 142 128 | 5/1985 | European Pat. Off. | ......... H02H 9/02 |
| 0 590 167 | 9/1992 | European Pat. Off. | ....... H03K 17/08 |
| 36 34 070 | 4/1988 | Germany | ..................... H03K 17/687 |
| 93.11608 | 6/1993 | WIPO | ............................ H02H 3/026 |

*Primary Examiner*—Ronald W. Leja
*Attorney, Agent, or Firm*—Kenyon & Kenyon

[57] ABSTRACT

A device for limiting overload currents using a semiconductor element with at least one controllable semiconductor having an electron source (source), an electron acceptor (drain) and a control electrode (gate) controlling the electron flow, which device has characteristic curves typical of a field-effect transistor (FET). In the case of alternating voltage, two FETs are connected in series, in complementary fashion. Arrangement is provided for internally obtaining the control voltage required for driving the semiconductor element from at least part of the load current and/or from at least part of the voltage drop across the semiconductor element.

19 Claims, 9 Drawing Sheets

CURRENT LIMITING DEVICE

This application is a continuation of U.S. patent application Ser. No. 08/596,240, filed Jul. 8, 1996, which was the National Stage of International Application No. PCT/DE93/00824, filed Sep. 8, 1993.

FIELD OF THE INVENTION

The present invention relates to a current limiter for limiting overload currents by means of a semiconductor element with at least one controllable semiconductor which has characteristic curves typical of a field-effect transistor (FET).

BACKGROUND INFORMATION

In the case of protective switchgear, such as power switches, motor protection switches or automatic cut-outs, and in the case of automatic circuit-breakers in general, it is desirable to sense overload currents, in particular short-circuit currents, quickly and to limit the overload currents to minimum possible values and finally to disconnect the overload currents. In the case of substantially mechanical automatic circuit-breakers, for example automatic cut-outs, use is made of so-called instantaneous trips, in which both the magnetic circuit is optimally designed and a magnet armature, often a plunger armature, quickly and forcibly makes impact with the contact system. Nevertheless, it has not been possible in practice to achieve contact opening times any shorter than about one millisecond. In this case, the short-circuit current continues to increase unhindered until contact opening. Only after contact opening is an arc produced, quickly conducted into an arc chamber and cooled at quenching plates, splitting the arc. The high arc voltages which this generates have the effect of limiting the short-circuit current and finally disconnecting it.

In the case of known automatic circuit-breakers, with a prospective short-circuit current of 6 kA, cos phi=0.6 and psi=60°, it is scarcely possible to obtain current time values any less than 4 ms for the rise time to the peak value, with a switching current of 4000 A, and an integral of the square of the current over time of 30,000 $A^2s$.

It has been suggested to use semiconductors for the current limitation in protective switchgear. This approach, however, is hampered or prevented in practice by various circumstances: 1) semiconductor elements generally have an inadequate current-limiting effect and an insufficient permissible energy absorption; 2) semiconductor elements generally have, in normal operation, a forward resistance of above 10 milliohms at 16 A; and 3) semiconductor elements also generally have an insufficient dielectric strength.

PCT International Application WO 93/11608 describes a power switch which acts as a current limiter for limiting overload currents by means of a semiconductor element with at least one controllable semiconductor with an electron source (source), an electron acceptor (drain) and a control electrode (gate) controlling the electron flow, which current limiter has characteristic curves of a field-effect transistor (FET), the load current flowing through the semiconductor element and, in the case of alternating voltage, two FETs being antiserially connected. In this case, an external control voltage is provided.

SUMMARY OF THE INVENTION

The present invention is based on the object of developing a current limiter comprising a semiconductor element with at least one controllable semiconductor, which reduces the previously customary disadvantages of semiconductor circuits to a technically usable extent.

The described object is achieved according to the present invention by a current limiter for limiting overload currents by means of a semiconductor element with at least one controllable semiconductor with an electron source (source), an electron acceptor (drain) and a control electrode (gate) controlling the electron flow of the load current flowing through the semiconductor element. The current limiter of the present invention has characteristic curves typical of a field-effect transistor and includes, if appropriate, as in the case of alternating voltage, two FETs connected antiserially, and means for internally obtaining the control voltage required for driving the semiconductor element from at least part of the voltage drop over the semiconductor element and/or at least part of the load current flowing through the semiconductor element. In this case, the control voltage required for driving the semiconductor element is obtained from at least part of the load current which flows through the semiconductor element. The control voltage can also be obtained from at least part of the voltage drop over the semiconductor element. The control voltage can also be achieved from the two measures in combination.

According to the present invention, the means for driving the semiconductor element using the voltage drop may be respectively a drive circuit connected to the drain and the gate of the semiconductor. The means for driving the semiconductor element using the load current can be a current-to-voltage converter situated in the load current.

The drive circuit in the case of direct voltage may, in the simplest case, comprise a resistor which is connected between the drain terminal and the gate terminal of an FET. A drive circuit in the case of alternating voltage may, in the simplest way, be constructed such that the drain terminals of two antiserially connected FETs are connected to the gate terminals via a valve and via a resistor, respectively. Such a circuit is suitable in connection with FETs of the enhancement type, that is to say with normally-off FETs, which have an n-channel, as a starting circuit, which makes it possible for the current limiter to run up into the operating state. Such a starting circuit is not required if normally-on FETs with n-channels, i.e., of the depletion type, are used. Depletion MOSFETs are particularly suitable in that case.

Also suitable as a drive circuit in the case of direct voltage is a constant-current source which is connected between the drain terminal and the gate terminal. A drive circuit in the case of alternating voltage may be advantageously constructed such that the drain terminals of two antiserially connected FETs (i.e., serially connected complimentary FETs) are connected to the gate terminals via respectively a valve and via a constant-current source.

Particularly suitable as the current-to-voltage converter for driving the semiconductor element using the load current is a transformer to whose secondary winding an element is connected for limiting the voltage in both directions of polarity, in particular two antiserially connected zener diodes, whose outputs are connected to the gate terminals via a rectifier circuit. Antiserially connected zener diodes are considered here to comprise all elements which have the effect of a voltage-limiting zener diode. In the case of alternating voltage, characteristic curves in the first and third quadrants of a diagram with the drain-source current on the y-axis against the drain-source voltage on the x-axis are limited to a desired drain-source current.

The use of a transformer between two antiserially connected FETs as an inductance for limiting short-circuit current is described in European Patent Application No. 92 116 358.0 (see, FIGS. 4 and 7), assigned to Siemens AG. In this case, the transformer serves at the same time for tying in a control voltage to be applied externally.

In the case of the current limiter with a transformer designed as a current-to-voltage converter, the drive voltage is obtained from the load current, i.e., internally. Furthermore, the advantage is achieved that the load current can be carried in a low-impedance primary winding with few turns and that the secondary side can be of a high-impedance design with many turns, in order to derive a voltage for the driving from the load current. It is in this case ensured by the voltage-limiting element that the drain-source current on a curve with the corresponding parameter of the gate-source voltage is limited in a low-loss manner.

It is advantageous to connect to a transformer, at its secondary winding, a rectifier circuit and to connect a capacitor between direct-voltage potential points for the driving voltage. More specifically, in such an embodiment, there is connected to the transformer at its secondary winding a rectifier circuit whose direct-voltage potential points are connected on the one hand to the gate terminals of the FETs and on the other hand via a central tap of the primary winding and a capacitor is connected between the direct-voltage potential points for the control voltage. The capacitor may be formed, if appropriate, by the gate-source capacitance of the FET if this is of adequate size. If voltage-limiting elements are used, it is advantageous for them to comprise zener diodes connected as a bridge rectifier whose output is connected to the gates.

The rectifier circuit may advantageously also be designed as a voltage multiplier circuit.

Finally, the current-to-voltage converter may be a chopper with a downstream voltage multiplier, whereby the driving voltage can be obtained from the load current without a transformer.

The solutions according to the present invention and their advantages can be further enhanced if the FETs are made from silicon carbide (SiC). In this case, the advantages of an FET made of silicon carbide and those of a current limiter complement one another.

A current limitation in connection with means for driving the semiconductor element using a voltage drop or from a load current can generally be achieved by connecting between the gate terminal and the source terminal an element with the effect of a current-limiting zener diode which is dimensioned such that the gate voltage of the semiconductor element is set to a value at which the desired limitation of the overload current occurs.

In addition to obtaining the drive voltage internally, it is also possible to provide on the semiconductor element a drive device for additional external driving, in which case corrective control voltages can be applied externally. It is also possible, by external driving to generate a voltage turning off the semiconductor element when a predetermined input signal is received. Such a current limiter then acts as a cut-out switch and can generally be constructed with semiconductors which have the described special properties. The current limiter may be designed as an integrated circuit on a chip, with discrete components or in a hybrid structure.

It may be advantageous for certain applications to arrange at least one mechanical switching contact in series with the semiconductor element. A relatively simple switching contact without special quenching means then suffices, since the current rise is limited by the current limiter. On the other hand, when it has been opened, the switching contact protects the current limiter against long-term overloading. This interaction permits advantageous configurations.

PCT International Application WO 93/11608 describes a protective switch of an automatic circuit-breaker design with two antiserially arranged FETs and a mechanical switching contact. In the case of this earlier protective switch, designed as a power switch, a unit comprising relays and switching contacts is connected in parallel with two antiserially connected FETs. In such a switch, the switching contacts are arranged in series with the interconnection of the FETs. However, the internal resistance of the semiconductor element at a certain control voltage has a low value, and with increasing voltage over the working electrodes there is a jump in the internal resistance, so that the triggering element of the relay is supplied with voltage and can initiate the disconnecting operation.

The mode of operation of the current limiter with a mechanical switching contact arranged in series differs fundamentally. The switching contact may be in engaging connection with a magnetic system directly or indirectly via an energy store, which magnetic system opens the switching contact in dependence on the current limiter.

A particularly favorable interaction of the semiconductor element and the magnetic system for the switching contact is achieved in an embodiment of the present invention in which the magnetic system has a primary winding of low impedance, relative to the secondary winding, and on the one hand forms the transformer for obtaining a control voltage from the load current and on the other hand forms, with the low-impedance primary winding, the excitation winding for the respective magnetic system whose armature is in operative connection with the switching contact. In this case, multiple use of structural elements in combined arrangement is achieved. In particular, the armature air gap may be bridged by an auxiliary yoke so that a well-closed magnetic circuit is produced for the current-to-voltage converter. The yoke is dimensioned in such a way that it already goes into saturation at comparatively low currents. As a result, both the function of the armature and that of the magnetic circuit for the current-to-voltage converter remain unimpaired in practice.

Thus, for this purpose, the working air gap is bridged by an auxiliary yoke which is dimensioned in such a way that it already goes into magnetic saturation at currents which are less than the desired operating current for the magnet armature.

The semiconductor element may generally be used in an automatic circuit-breaker, such as for example a power switch, an automatic cut-out or in a motor protection switch or other protective devices, as a current-limiting part with the function of a so-called limiter. The semiconductor element and the mechanical switching contact may be part of physically separate switching devices.

DETAILED DESCRIPTION

Figure 1:
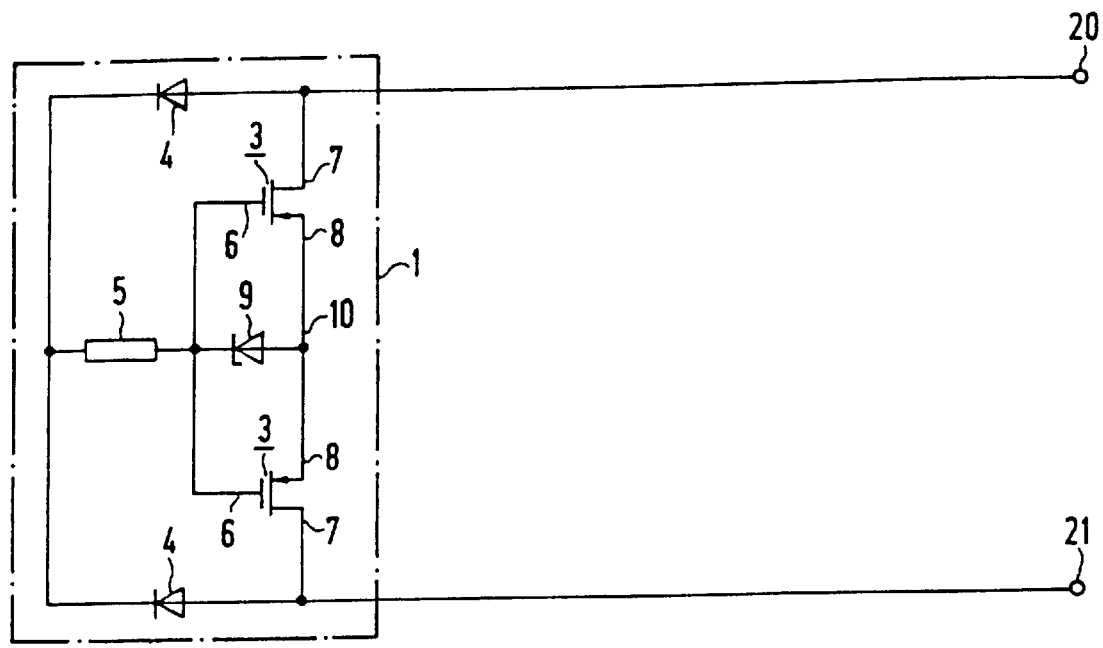
FIG. 1 shows a first, simplified exemplary embodiment of a current limiter in accordance with the present invention, in which the control voltage is obtained from the voltage drop over the semiconductor element.
Figure 14:
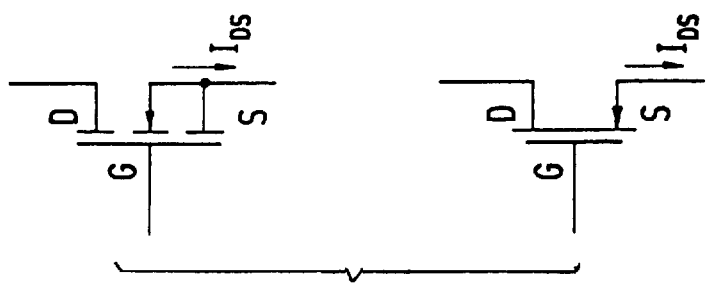
FIG. 14 represents the full symbol for a normally-off FET, with an n-channel, and thereunder the corresponding abbreviated symbol as used in the present application.

FIG. 1 illustrates a first exemplary embodiment of a current limiter in accordance with the present invention in which a semiconductor element 1 comprises field-effect transistors (FETs) 3. In the exemplary embodiment, the FETs 3 may, corresponding to the representation in FIG. 14, be understood as those of the enhancement type, which are normally off and have, for example, an n-channel. An abbreviated symbol for such a FET is also shown in FIG. 14. Represented in FIG. 1 is a current limiter for alternating voltage, which with two polarities to be switched operates with two antiserially connected FETs 3. For driving the semiconductor element, or the FET, the required control voltage is obtained from the voltage drop across the semiconductor element 1 by connecting from the drain terminal the FET 3 a valve 4, for example a diode, in series with a resistor 5 which is coupled to the gate terminal 6 of the FET 3. In the case of a current limiter adapted for alternating voltages, in which two antiserially connected FETs 3 are used (as shown in FIG. 1), a connection to the gate terminals 6 of the FETs is established between the drain terminals 7 via respective valves 4 and via a resistor 5. The source terminals 8 of the FETs 3 are connected to one another.

If only a single-ended potential is to be switched, it suffices, on the basis of FIG. 1, to have either the upper or lower FET 3 in connection with the corresponding valve 4 and the resistor 5. The source terminal 8 may then be connected to ground.

In the exemplary embodiment of FIG. 1, with two antiserially connected FETs 3 as the voltage-limiting element 9 there is a zener diode connected between the gate terminals 6 and the connection 10 of the source terminals 8 of the antiserially connected FETs 3. The connection 10 carries the load current.

The gate voltage of the antiserially connected FETs 3 is thus obtained via the valves 4 and via the resistor 5. The voltage-limiting element 9 has the effect of limiting the gate voltage and consequently a short-circuit current flowing at a maximum.

Figure 2:
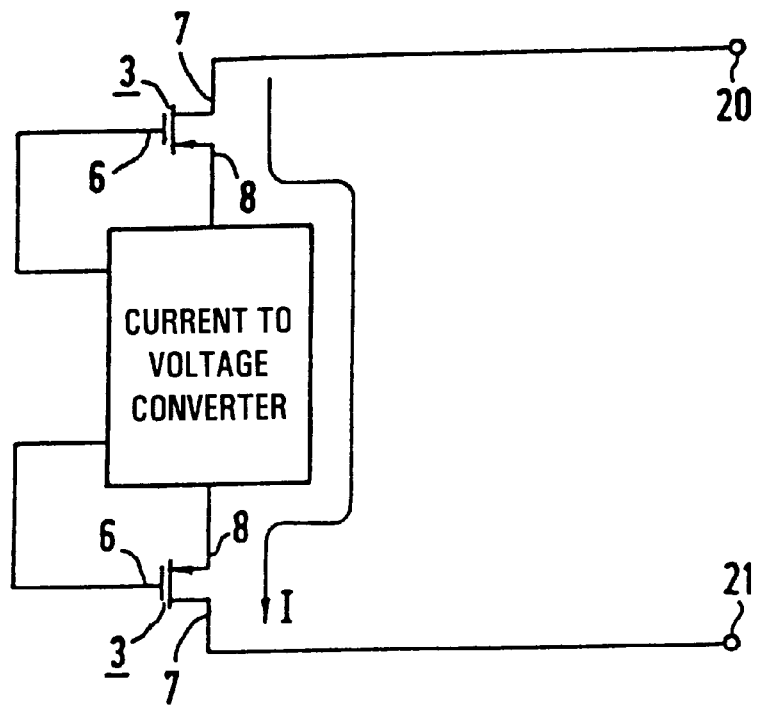
FIG. 2 illustrates a current limiter whose control voltage is obtained from the load current.
Figure 3:
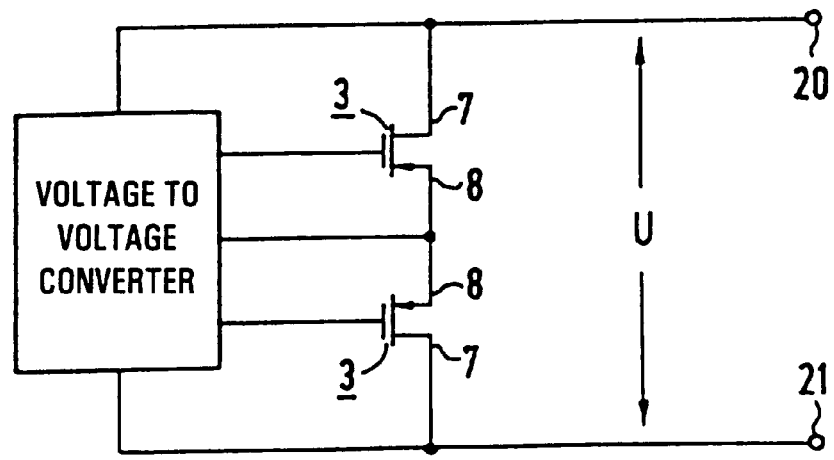
FIG. 3 depicts a current limiter whose control voltage is obtained from the voltage drop over the semiconductor element.
Figure 4:
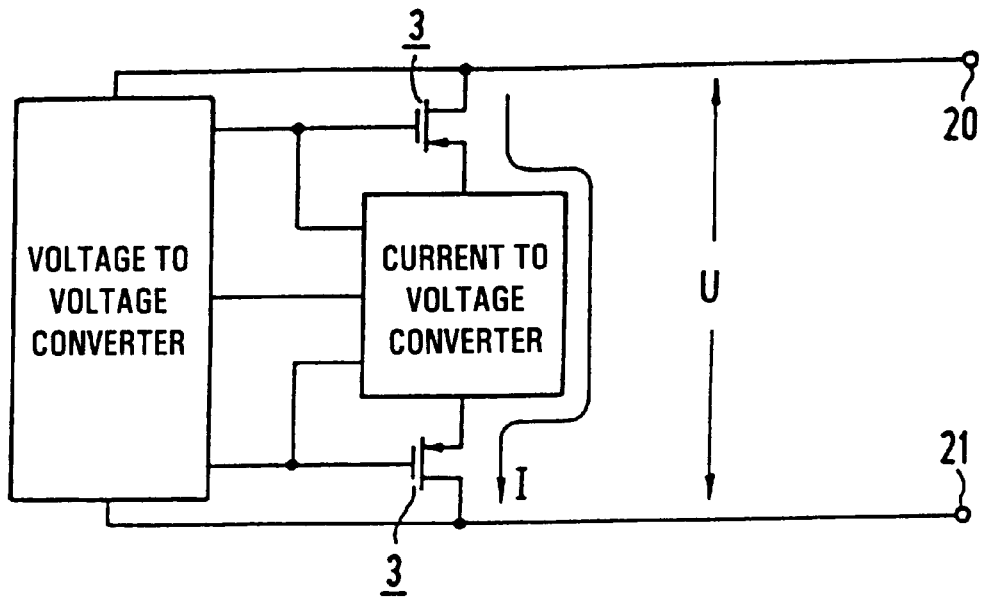
FIG. 4 illustrates a current limiter whose control voltage is obtained from the load current and from the voltage drop over the semiconductor element.

In FIG. 2 it is illustrated how the control voltage $U_S$ is obtained as a function of the load current I, $U_S=f(I)$. In FIG. 3 it is illustrated that the control voltage $U_S$ can be achieved as a function of the voltage drop U over the semiconductor element, i.e., $U_S=f(U)$. In FIG. 4 it is illustrated how the control voltage $U_S$ can be obtained as a function of the load current and as a function of the voltage drop over the semiconductor element, i.e., $U_S=f(I)$ and $U_S=f(U)$.

Figure 5:
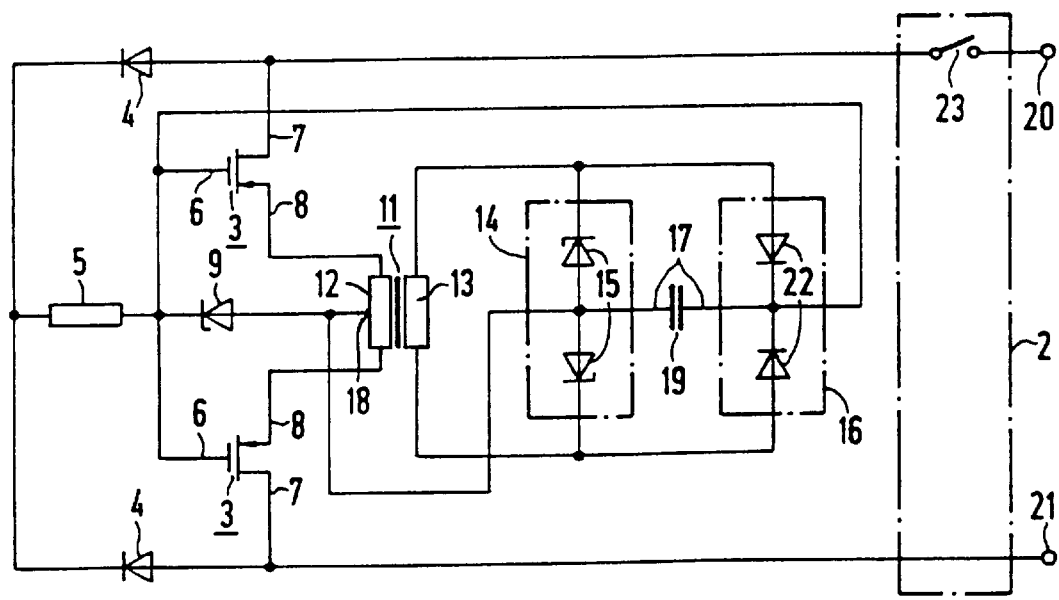
FIG. 5 shows a the current limiter with a current-to-voltage converter between two antiserially connected FETs, with the control voltage being obtained from the load current and a switching contact being used in series with the current limiter.

In the embodiment according to FIG. 5, a mechanical switching contact 2 is connected in series with the current limiter. The current limiter operates with two antiserially connected FETs, which are interconnected by their source terminals via a primary winding 12 of a current-to-voltage converter 11. A further essential feature in this embodiment is that there is connected to the current-to-voltage converter 11 on its secondary side, or at its secondary winding 13, an element 14 limiting voltage in both directions of polarity, in particular two antiserially connected zener diodes 15. Zener diodes 15 connected on the secondary side limit the voltage on the secondary side so that a voltage drop of only a few tens of millivolts occurs on the primary side, owing to the transformation ratio of the current-to-voltage converter 11. Load current also flowing through the FETs 3 on the primary side is consequently limited by the low-loss limitation of the voltage on the secondary side by the current-to-voltage converter. This effect acts in concert with the limitation inherent in semiconductors brought about by the special driving of the FETs 3. On the other hand, the transformation ratio of the current-to-voltage converter 11 permits a relatively high voltage to be carried as the gate-source voltage to the primary side, whereby the ON resistance is reduced. $R_{ON}$ is obtained with large gate-source voltages. Details of the effect are to be explained later with reference to FIG. 15.

In the case of the exemplary embodiment according to FIG. 5, there is further connected to the current-to-voltage converter 11 on its secondary side a rectifier circuit 16, which is connected on the one hand to the gate terminal 6 of the FETs 3 and on the other hand via a central tap 18 of the primary winding 12. In the exemplary embodiment, a capacitor 19 performs a dual function as a storage capacitor. On the one hand, the capacitor 19 isolates the direct-voltage potential points 17 for the control voltage. In addition, the capacitor 19 ensures that, in the family of current-voltage characteristic curves of the semiconductor element 1 with the antiserially connected FETs 3, it is not required in each case to run up to the ON resistance between the parameter-dependant characteristic curves for the gate-source voltage in the first and third quadrants, but that even in the case of alternating voltage it is possible to operate between the first and the third quadrants at the ON resistance. This is to be explained further with reference to FIG. 15. The capacitor 19 in the exemplary embodiment according to FIG. 6 serves in this second function. In said exemplary embodiment, the direct-voltage potential points 17 of the rectifier circuit 16 are also provided without the capacitor 19.

In the case of the current limiter according to FIG. 5, the current-to-voltage converter 11 is not terminated in the customary way by a resistor, but by the zener diodes 15 of the voltage-limiting element 14. The tap of the direct-voltage potential points 17 has the effect that on the primary side of the converter there is carried a gate auxiliary voltage, which supplements or substitutes the auxiliary voltage generation on the primary side, as has been explained with reference to FIG. 1. On the secondary side of the current-to-voltage converter 11, for example at a zener voltage of about 9.1 V and a forward voltage of about 0.9 V over the zener diodes 15 in one direction, a voltage totaling about 10 V is achieved. Thus, if a current large enough to overcome the inductive resistance flows in the primary winding 12, there occurs on the primary side, as a result of the 10 V on the secondary side, a voltage corresponding to the transformation ratio of the current-to-voltage converter 11. For example, with a transformation ratio of 1 to 1000, a voltage of just 10 mV therefore occurs at the primary winding 12.

The operation of the circuit according to FIG. 5 will now be described in further detail.

If there is a voltage at the connection terminals 20 and 21 of the automatic circuit-breaker as the result of a switched-on load, there flows via the valves 4, or the diodes, a current dependent on the polarity of the alternating voltage. As a result of the voltage drop over the resistor 5 there is at the gate terminals 6 a potential which is less positive with regard to the positive terminal voltage at 20, so that at the FETs 3 there is an opening gate-source voltage and the drain-source paths are brought into the ON state. The current flowing through the primary winding 12 of the current-to-voltage converter 11 generates at the high-impedance secondary winding a voltage which, on reaching the zener voltage of the upper or lower zener diode 15, is limited to the zener voltage plus the forward voltage of the other zener diode, to be precise, in both directions of current flow corresponding to the alternating voltage. At the secondary winding 13, there is produced in this case a virtually square-wave alternating voltage, which generates by means of the diodes 22 for the rectification in the circuit of a full-wave rectifier at the capacitor 19 a direct voltage of the size of the zener voltage of each of the zener diodes 15. This direct voltage is fed to both gate-source paths of the FETs 3, whereby the latter are kept in the ON state, without continuing to require a voltage drop over the resistor 5. In other words, current no longer flows through the resistor 5.

Figure 6:
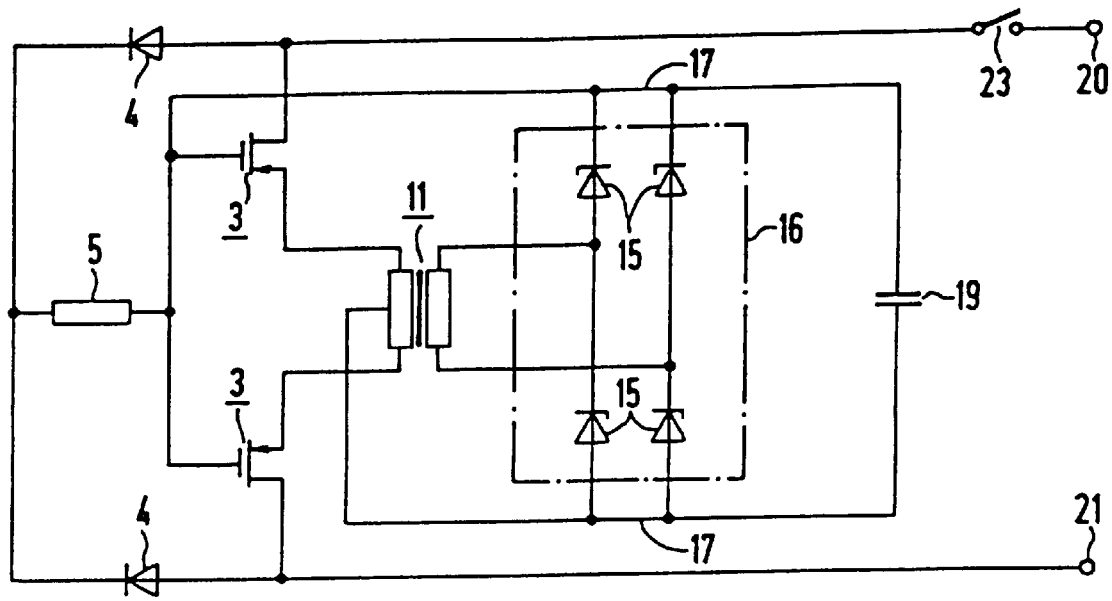
FIG. 6 depicts a current limiter with a switching contact, in which antiserially connected zener diodes are arranged as voltage-limiting elements in bridge connection on the secondary side of the current-to-voltage converter and in which a capacitor is connected across the rectified voltage output for the control voltage on the secondary side.

In the exemplary embodiment according to FIG. 6, the voltage-limiting element 14 takes the form of a bridge circuit comprising four zener diodes 15. In this circuit, there is no need for a current-limiting element 9 on the primary side of the current-to-voltage converter 11. A switching contact 23 is again arranged in series.

Figure 7:
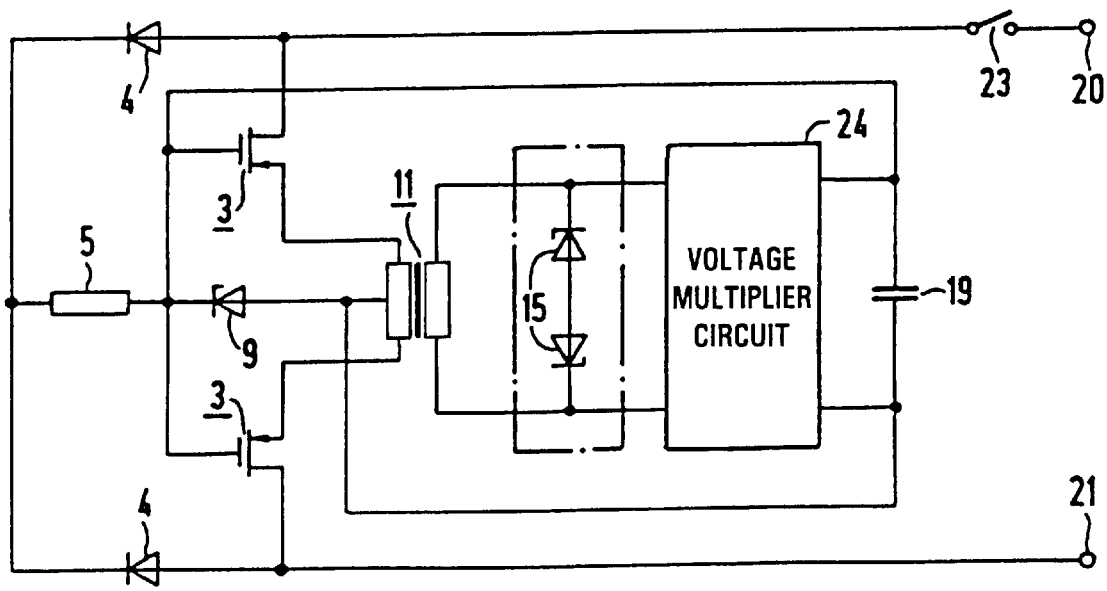
FIG. 7 diagrammatically illustrates the use of a voltage multiplier circuit for a current limiter in accordance with FIG. 6.

The amplitudes of the alternating voltage in the secondary winding 13 of the current-to-voltage converter 11 can be kept smaller if a voltage multiplier circuit 24 is connected downstream of the voltage-limiting element 14, as is illustrated in FIG. 7.

Figure 8:
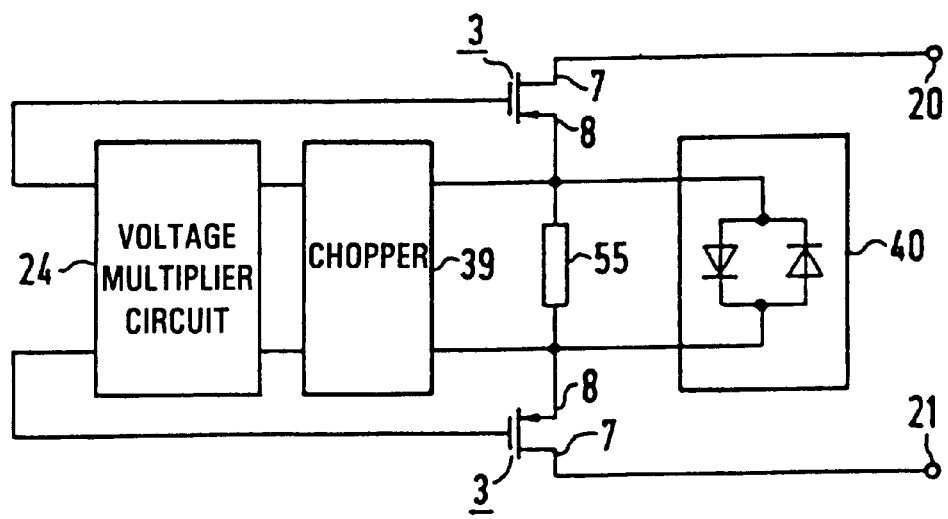
FIG. 8 depicts an exemplary embodiment of a current limiter with control from the load current, which includes a current-to-voltage converter designed as a chopper with a downstream voltage multiplier.

For driving from the load current, the current-to-voltage converter according to FIG. 8 may be designed as a chopper 39 with a downstream voltage multiplier circuit 24. The voltage occurring at a resistor 55 under load current is present at the chopper 39. For limiting the voltage drop and to minimize the power loss, it is advantageous to provide a voltage-limiting means 40. In the exemplary embodiment, this may be the two diodes connected in antiparallel, which limit the voltage drop over the resistor 5 to the forward resistance of the diodes.

Figure 9:
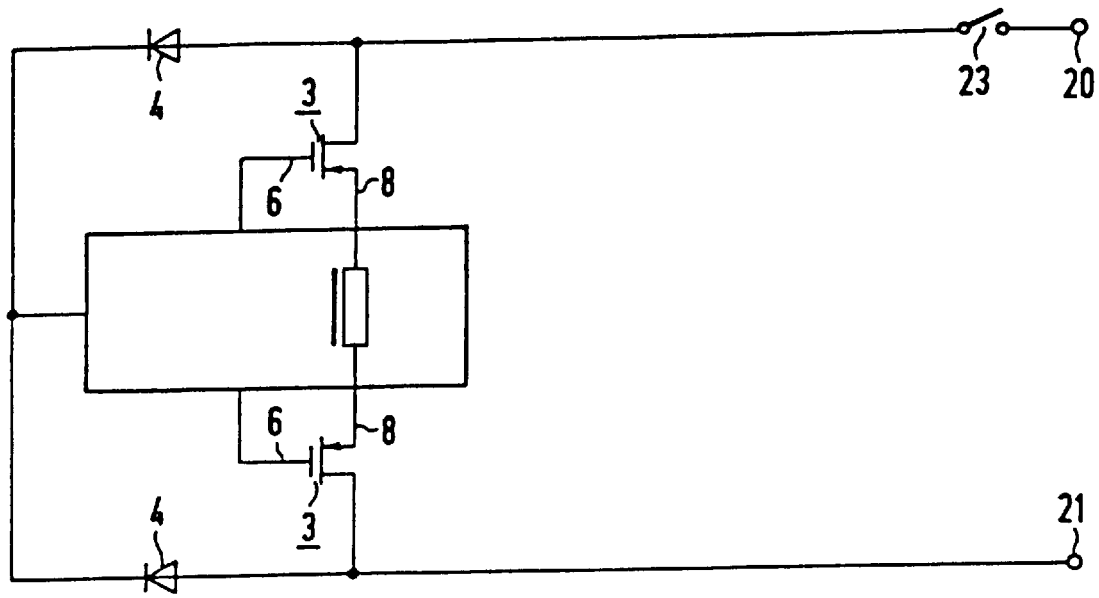
FIG. 9 illustrates a current limiter with control voltage conversion from the load current.

In FIG. 9, the generation of the control voltage between the gate terminals 6 and the source terminals 8 of the field-effect transistors 3 is diagrammatically reproduced. The generation of the control voltage may be divided between a control voltage generation 25, in the case of starting, and an auxiliary voltage generation 26, as has been explained in detail with reference to FIG. 5.

Figure 10:
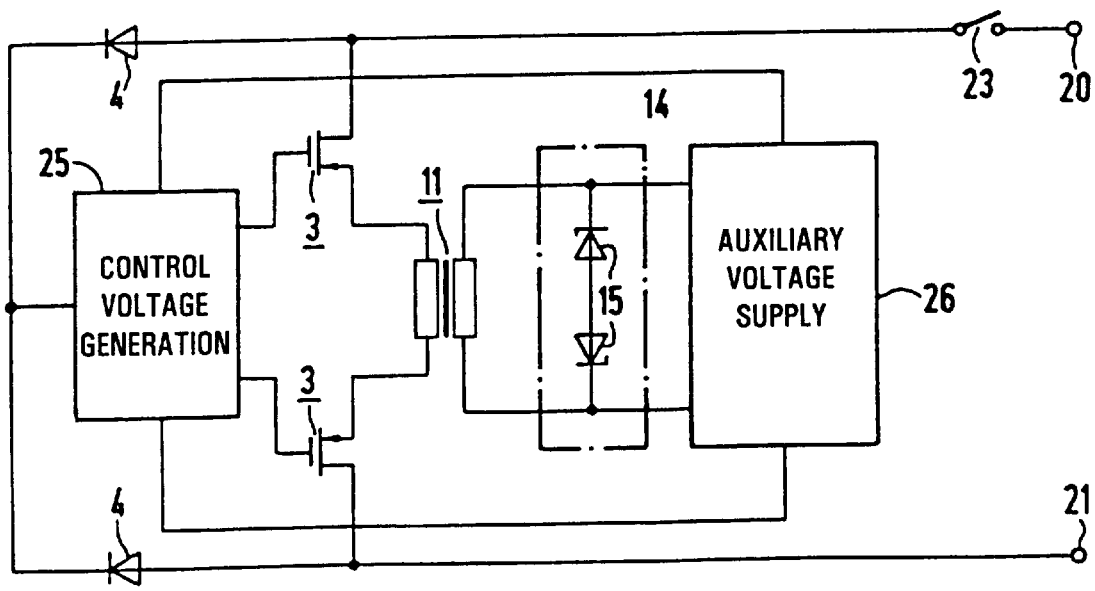
FIG. 10 illustrates a current limiter with control voltage conversion in which the current-to-voltage converter is divided up by an auxiliary voltage conversion on the secondary side and a voltage conversion for the gates.

In FIG. 10, the construction of a current limiter with control voltage supply 25 and auxiliary voltage supply 26 is illustrated diagrammatically. The control voltage supply 25 may be designed as a starting circuit, so that the control voltage is then taken over in working operation by the auxiliary voltage supply 26.

Figure 11:
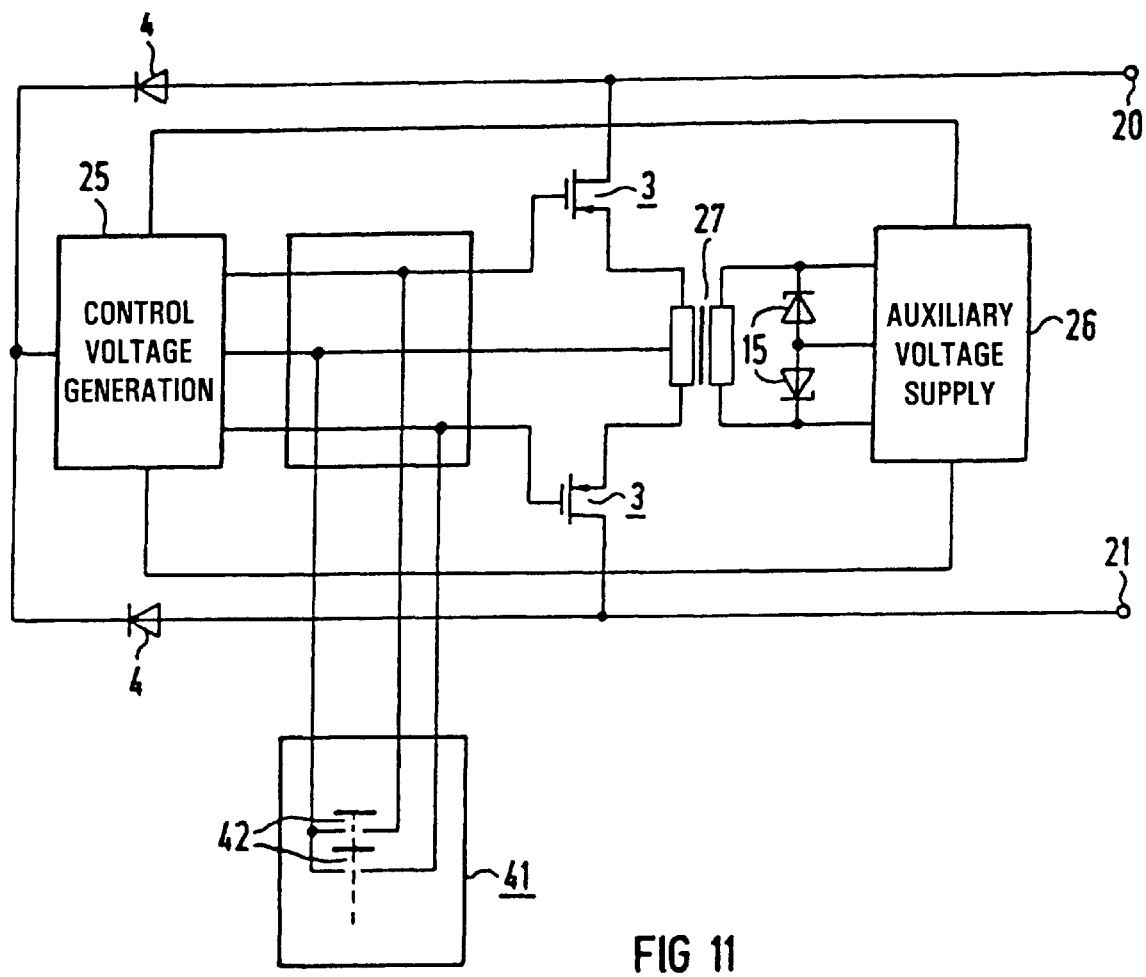
FIG. 11 how additional external driving can be performed based on the current limiter of FIG. 10.

To be able to also drive the semiconductor element externally, an external drive device 41 according to FIG. 11 may be provided. If actuation contacts 42 are closed, the gate-source voltage is short-circuited, so that a normally-off FET switches over into the off state.

Figure 12:
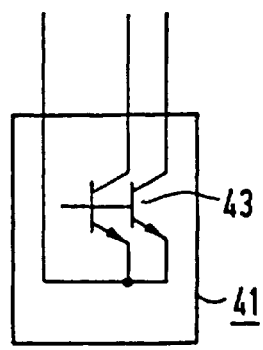
FIG. 12 depicts an alternative design for a command element for additional external driving according to FIG. 11.

The external drive device 41 may also operate with semiconductor contacts 43 according to FIG. 12.

Figure 13:
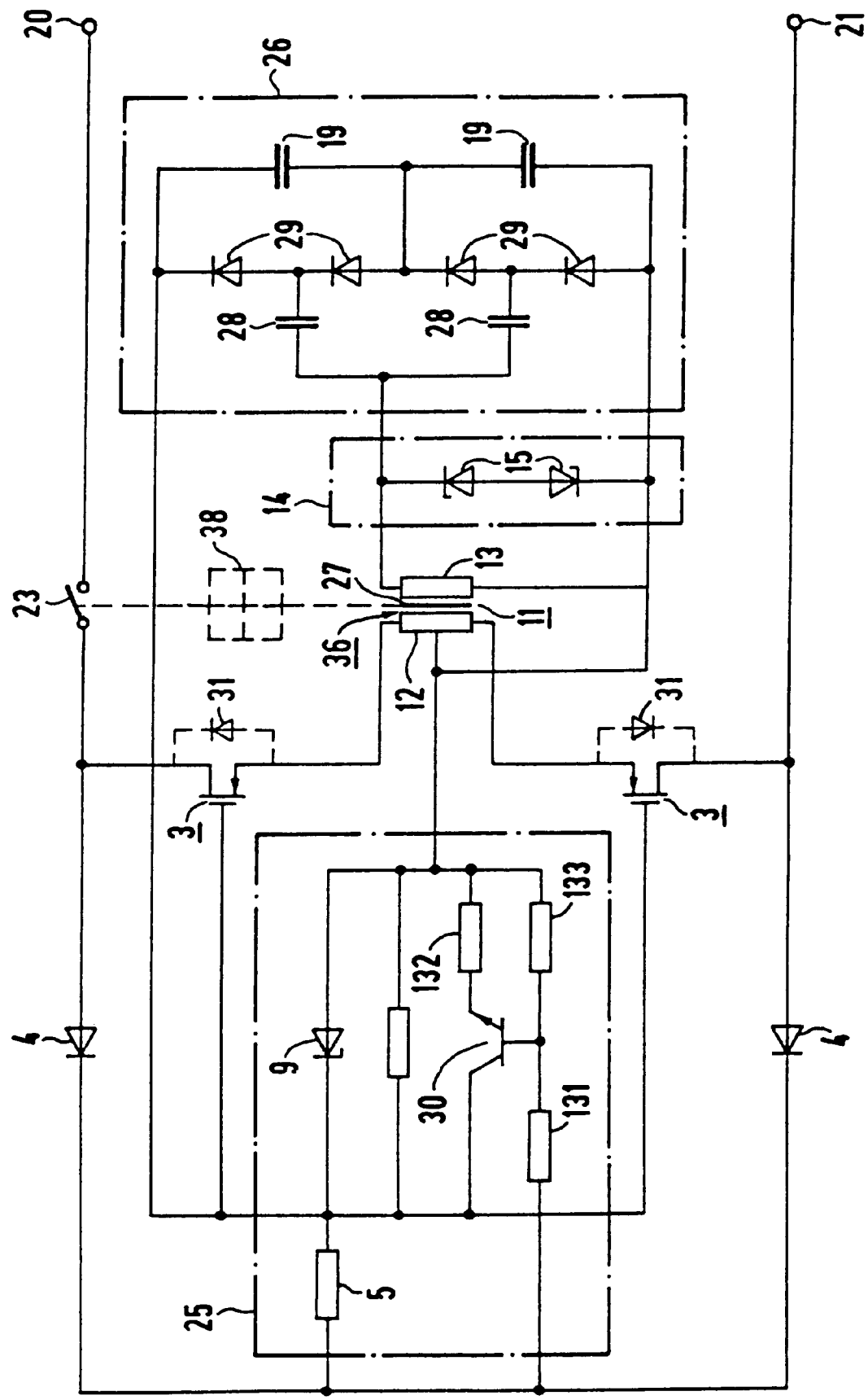
FIG. 13 shows an exemplary embodiment of a current limiter in which a transformer as a current-to-voltage converter is in combination with the magnetic system for actuation of the switching contact.

In FIG. 13 there is illustrated on the one hand an advantageous refinement of the arrangement according to FIG. 10 in which the auxiliary voltage conversion takes the form of a voltage multiplier circuit, and on the other hand a development according to which the low-impedance primary winding is in operative connection with an armature 27, which is to be brought into engaging connection with the switching contact 23. Such a design is particularly inexpensive, since the current-to-voltage converter 11 and the magnetic system 36, which opens the switching contact via the armature 27, are structurally and functionally combined. In addition, an energy store 38 of the latch type may be provided. In this case, a high-impedance winding with many turns may be applied as a secondary winding 13 to the low-impedance primary winding 12, driving the armature. In this case, a small auxiliary yoke 37 (see FIG. 16) may close the magnetic circuit for the functioning of the current-to-voltage converter 11. The auxiliary yoke 37 is advantageously dimensioned so that it already goes into saturation at comparatively low currents, so that the function of the armature 27 acting on the switching contact 23 is virtually uninfluenced. The low-impedance primary winding 12 may comprise few turns, for example two to four turns, and a favorable voltage range for the auxiliary voltage conversion may be raised on the secondary side up to a desired voltage value by the voltage multiplier circuit. The voltage multiplier circuit comprises the capacitors 28 and 19, the capacitors 19 at the same time providing the direct voltage for the driving of the FETs 3, and also the diodes 29, which in the circuit reproduced at the same time supply the rectification.

The control supply 25 according to FIG. 13 shows one possibility for producing a "fall-back" characteristic curve. The essential components for this are the transistor 30 and the resistors 131, 132 and 133. The operation of this part of the circuit will now be described. If the current-limiting action of the FETs 3 commences due to increased current, such as occurs for example in the case of a short-circuit, the voltage across the terminals 20 and 21 increases. This voltage appears at the bridge rectifier, which is formed by the diodes of the valves 4 and the body (or "inverted")

diodes 31 of the FETs 3. As is known, the term "body diode" refers to the internal diode action, inherent in every boundary layer, in particular a MOSFET, of the pn junction from source to drain. The voltage present at the bridge rectifier described is also present at the series connection of the resistors 131 and 133, causing a voltage drop across the resistor 133 which switches the transistor 30 to a conductive state. The size of the resistor 132 can cause the turning on of a gate-source voltage which becomes smaller and smaller with increasing voltage at the terminals 20 and 21 and consequently reduces a load current through the FETs 3.

The exemplary embodiment shown illustrates only one possibility for producing a fall-back characteristic curve on the principles according to the present invention. As is known, any desired characteristic curve can be produced with an operational amplifier.

In FIG. 14, the full symbol for an FET is reproduced in the upper representation and the abbreviated symbol, as used in the present description, is reproduced in the lower representation. The customary abbreviations for drain, gate and source are used and the positive direction of the drain-source current is indicated. The representation according to FIG. 14 shows an FET of the enhancement type, that is to say a normally-off FET, which has an n-channel. In particular, the manner of representation according to FIG. 14 is to be understood as a MOSFET. It goes without saying that the reproduced circuits according to FIGS. 1 to 13 can also be realized by other corresponding components, in particular by other FETs. For instance, if p-channel FETs are used, just the customary polarity reversal has to be carried out. What is essential is that characteristic curves such as those represented in FIG. 15 can be realized, and hence that, for direct voltage, a maximum current can be set irrespective of the voltage and that, for alternating voltage, such conditions prevail in two diagonally opposite quadrants. The circuits reproduced here by way of example on the basis of certain FETs are to be regarded in this general sense.

The operation of the current limiter will now be described with reference to FIG. 15.

Figure 15:
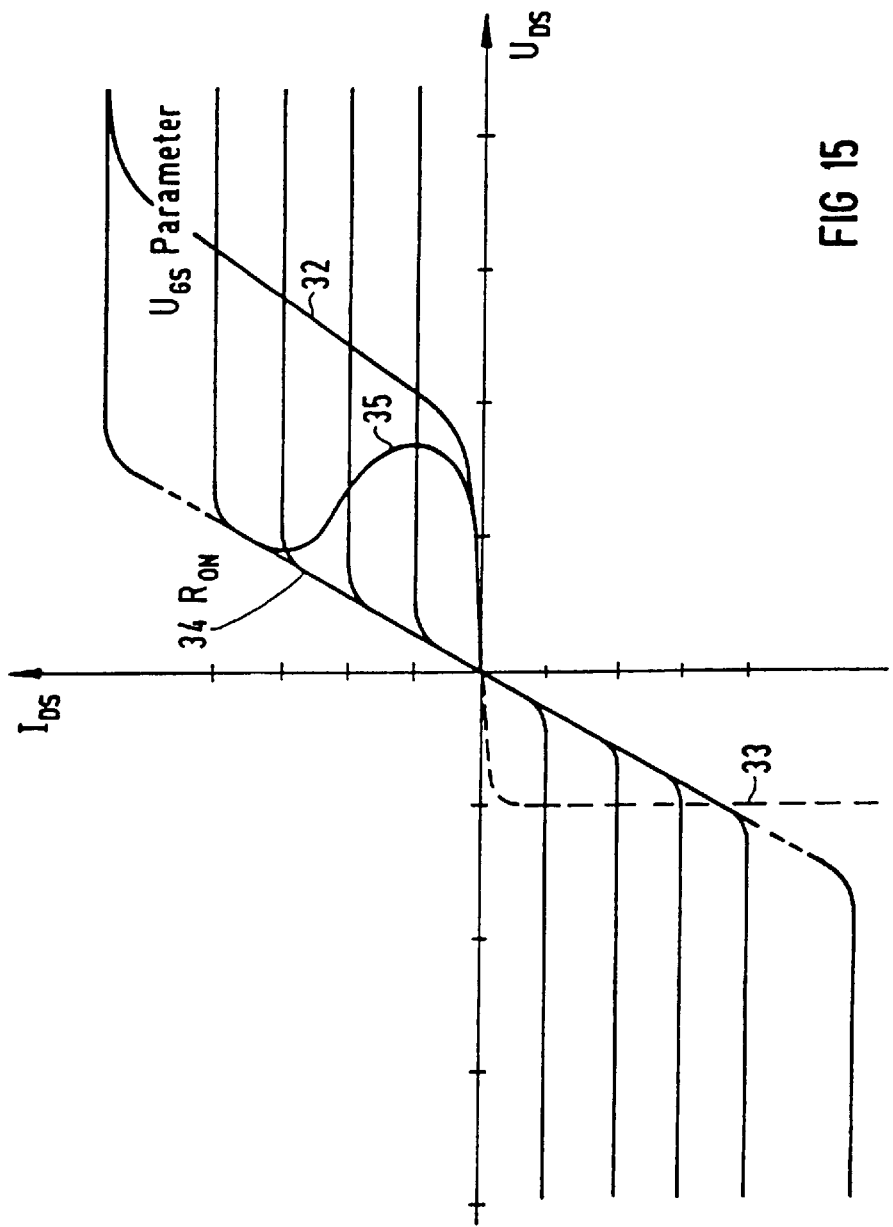
FIG. 15 illustrates operating characteristics of a current limiter in accordance with the present invention.

FIG. 15 shows a graph of the drain-source current $I_{DS}$, plotted on the y-axis, and the drain-source voltage $U_{DS}$, plotted on the x-axis. An FET of the type described here, such as that explained with reference to FIG. 14, intrinsically has a characteristic curve 32 which, with a negative drain-source voltage, goes over into the characteristic curve 33 of the body diode. The horizontal characteristic curves are obtained with a parameter of gate-source voltage and limit the drain-source current in the case of corresponding wiring. At high gate-source voltages, a steep ON resistance, $R_{ON}$, is achieved. With an antiserial connection of FETs, for the case of alternating voltage, a symmetrical mode of operation is achieved between the first quadrant and third quadrant, the characteristic curve 33 of the body diode no longer having any effect. A circuit with a current-to-voltage converter, as described, achieves the effect of running up over the characteristic curve 35, which enters into the straight line for the physically predetermined ON resistance of the FETs used.

Running up for each direction of polarity of an alternating voltage is avoided in an antiserial arrangement of FETs if a capacitor 19 is used as a storage capacitor, as described. The current-limiting action of the antiserially connected FETs then develops between a chosen horizontal characteristic curve with the corresponding gate-source voltage as the parameter in the first quadrant and one in the third quadrant in connection with a transition of the characteristic curve 34 for the ON resistance. In this case, the area between the characteristic curve 32 and a characteristic curve chosen on the left in the first quadrant acts as the loss saving, as can be seen illustrated by the product of the drain-source current and the drain-source voltage. The possibilities of the principles described are further enhanced in a considerable way by the use of FETs of silicon carbide. The semiconductor element 1, which is connected in series with the switching device, can be realized in the various types of design in each case as a complete unit or partially as an integrated circuit. The current limiter can also have a wide variety of applications without a switching device.

Figure 16:
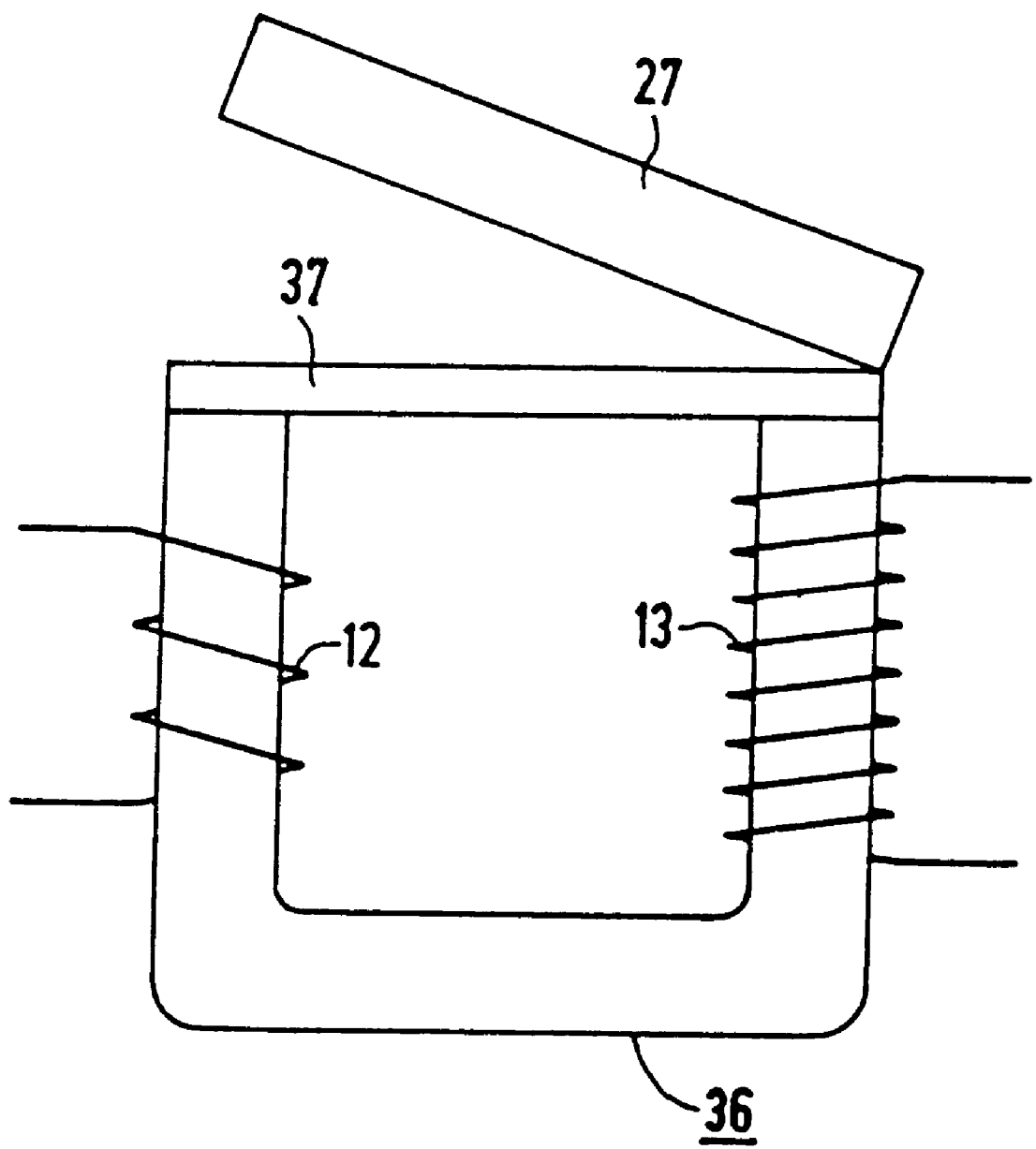
FIG. 16 depicts a magnetic system for a current limiter whose working air gap is bridged by an auxiliary yoke which is dimensioned in such a way that it already goes into magnetic saturation at currents which are less than the desired operating current for the magnet armatures.

FIG. 16 shows a magnetic system 36 with a primary winding 12 and a secondary winding 13, which system has an auxiliary yoke 37 and an armature 27. Such a magnetic system is advantageous for the structural combination of a current limiter with a switching device, as has already been explained.

We claim:

1. A current limiter for limiting overload currents, comprising:

a semiconductor element inserted into a load current path and including at least one controllable semiconductor structure, the at least one controllable semiconductor structure including:
 a first FET, and
 a second FET connected antiserially with the first FET, each one of the first FET and the second FET having a source, a drain, and a gate; and means for internally obtaining a control voltage required for driving the semiconductor element from at least one of at least a part of a voltage drop on the semiconductor element between the drain and the gate of one of the first FET and the second FET and at least a part of a load current flowing through the semiconductor element, the means for obtaining the control voltage including at least one of:
 a first drive circuit for use during a d.c. voltage condition and including a constant current source connected to the load current path,
 a second drive circuit for use during the d.c. voltage condition and including a first resistor connected between the drain and the gate of at least one of the first FET and the second FET,
 a third drive circuit for use during an a.c. voltage condition and including a second resistor and at least one valve connected between the drain and the gate of at least one of the first FET and the second FET, and
 a current-to-voltage converter connected in the load current path of the semiconductor element and used to obtain the control voltage from at least the part of the load current flowing through the semiconductor element;

wherein the current limiter has characteristic curves typical of a field-effect transistor.

2. The current limiter according to claim 1, wherein means for obtaining the control voltage includes the current-to-voltage converter, the current-to-voltage converter including a chopper circuit having a downstream voltage multiplier.

3. The current limiter according to claim 1, wherein each one of the first FET and the second FET is formed from silicon carbide.

4. The current limiter according to claim 1, further comprising a current limiting element connected to at least one of a connection point between the gate terminal of the first FET and the gate terminal of the second FET and a connection point between the source terminal of the first FET and the source terminal of the second FET, the current limiting element being dimensioned so that a gate voltage of at least one of the first FET and the second FET is set at a value at which a desired limitation of at least one of the overload currents occurs.

5. The current limiter according to claim 4, wherein the current limiting element is a current limiting zener diode.

6. The current limiter according to claim 1, further comprising a drive device coupled to the semiconductor element, the drive device providing an additional external driving.

7. The current limiter according to claim 6, wherein the drive device generates a voltage for turning off the semiconductor element in response to a predetermined input signal.

8. The current limiter according to claim 1, further comprising at least one mechanical switching contact connected in series with the semiconductor element.

9. The current limiter according to claim 8, further comprising a magnetic system coupled to the at least one mechanical switching contact through one of a direct connection and an indirect connection using an energy storing device.

10. The current limiter according to claim 9, wherein a primary winding of the magnetic system has a lower impedance than that of a secondary winding of the magnetic system, the magnetic system acting as an excitation winding through the primary winding, the magnetic system including an armature in an operative connection with the at least one mechanical switching contact.

11. The current limiter according to claim 8, wherein the semiconductor element and the at least one mechanical switching contact are respectively part of physically separate switching devices.

12. The current limiter according to claim 1, wherein the semiconductor element is used as a current-limiting part in an automatic circuit-breaker corresponding to one of a power switch, an automatic cut-out switch, and a motor protection switch.

13. The current limiter according to claim 1, wherein the control voltage is obtained automatically.

14. The current limiter according to claim 1, wherein the means obtains the control voltage without utilizing an external arrangement.

15. A current limiter for limiting overload currents, comprising:
   a semiconductor element inserted into a load current path and including at least one controllable semiconductor structure, the at least one controllable semiconductor structure including:
      a first FET, and
      a second FET connected antiserially with the first FET, each one of the first FET and the second FET having a source, a drain, and a gate;
   means for obtaining a control voltage required for driving the semiconductor element from at least one of at least a part of a voltage drop on the semiconductor element between the drain and the gate of one of the first FET and the second FET and at least a part of a load current flowing through the semiconductor element, the means for obtaining the control voltage including at least one of:
      a first drive circuit for use during a d.c. voltage condition and including a constant current source connected to the load current path,
      a second drive circuit for use during the d.c. voltage condition and including a first resistor connected between the drain and the gate of at least one of the first FET and the second FET,
      a third drive circuit for use during an a.c. voltage condition and including a second resistor and at least one valve connected between the drain and the gate of at least one of the first FET and the second FET, and
      a current-to-voltage converter connected in the load current path of the semiconductor element and used to obtain the control voltage from at least the part of the load current flowing through the semiconductor element;
   a voltage limiting element including a first zener diode and a second zener diode connected antiserially with the first zener diode, wherein the voltage limiting element limits a voltage applied thereto in both directions of polarity; and
   a rectifier circuit, wherein the current-to-voltage converter includes a transformer, wherein the voltage limiting element is connected to a secondary winding of the transformer, and wherein the first zener diode is connected to the gate of one of the first FET and the second FET through the rectifier circuit and the second zener diode is connected to the gate of another one of the first FET and the second FET through the rectifier circuit;
   wherein the current limiter has characteristic curves typical of a field-effect transistor.

16. The current limiter according to claim 15, further comprising a capacitor, wherein the rectifier circuit includes a plurality of direct-voltage potential points and is connected to the secondary winding of the transformer, each direct-voltage potential point being connected to a corresponding one of the gate of the first FET and the gate of the second FET and to a primary winding of the transformer through a central tap, and wherein the capacitor is connected between the plurality of direct-voltage potential points.

17. The current limiter according to claim 15, wherein the rectifier circuit includes a voltage multiplier circuit.

18. A current limiter for limiting overload currents, comprising:
   a semiconductor element inserted into a load current path and including at least one controllable semiconductor structure, the at least one controllable semiconductor structure including:
      a first FET, and
      a second FET connected antiserially with the first FET, each one of the first FET and the second FET having a source, a drain, and a gate;
   means for obtaining a control voltage required for driving the semiconductor element from at least one of at least a part of a voltage drop on the semiconductor element between the drain and the gate of one of the first FET and the second FET and at least a part of a load current flowing through the semiconductor element, the means for obtaining the control voltage including at least one of:
      a first drive circuit for use during a d.c. voltage condition and including a constant current source connected to the load current path,
      a second drive circuit for use during the d.c. voltage condition and including a first resistor connected between the drain and the gate of at least one of the first FET and the second FET,
      a third drive circuit for use during an a.c. voltage condition and including a second resistor and at least one valve connected between the drain and the gate of at least one of the first FET and the second FET, and a current-to-voltage converter connected in the load current path of the semiconductor element and used to obtain the control voltage from at least the part of the load current flowing through the semiconductor element; and a bridge rectifier including a plurality of zener diodes and a plurality of direct-voltage outputs, each direct-voltage output being connected to a corresponding one of the gate of the first FET and the gate of the second FET, wherein the current-to-voltage converter includes a transformer having a secondary winding coupled to the bridge rectifier;

wherein the current limiter has characteristic curves typical of a field-effect transistor.

19. A current limiter for limiting overload currents, comprising:

a semiconductor element inserted into a load current path and including at least one controllable semiconductor structure, the at least one controllable semiconductor structure including:
 a first FET, and
 a second FET connected antiserially with the first FET, each one of the first FET and the second FET having a source, a drain, and a gate;

means for obtaining a control voltage required for driving the semiconductor element from at least one of at least a part of a voltage drop on the semiconductor element between the drain and the gate of one of the first FET and the second FET and at least a part of a load current flowing through the semiconductor element, the means for obtaining the control voltage including at least one of:
 a first drive circuit for use during a d.c. voltage condition and including a constant current source connected to the load current path,
 a second drive circuit for use during the d.c. voltage condition and including a first resistor connected between the drain and the gate of at least one of the first FET and the second FET,
 a third drive circuit for use during an a.c. voltage condition and including a second resistor and at least one valve connected between the drain and the gate of at least one of the first FET and the second FET, and
 a current-to-voltage converter connected in the load current path of the semiconductor element and used to obtain the control voltage from at least the part of the load current flowing through the semiconductor element;

at least one mechanical switching contact connected in series with the semiconductor element;

a magnetic system coupled to the at least one mechanical switching contact through one of a direct connection and an indirect connection using an energy storing device, wherein a primary winding of the magnetic system has a lower impedance than that of a secondary winding of the magnetic system, the magnetic system acting as an excitation winding through the primary winding, the magnetic system including an armature in an operative connection with the at least one mechanical switching contact; and an auxiliary yoke that bridges a working air gap of the magnetic system, the auxiliary yoke being dimensioned in such a way that the auxiliary yoke enters into a magnetic saturation condition at currents which are less than a desired operating current for the armature;

wherein the current limiter has characteristic curves typical of a field-effect transistor.

* * * * *